US010608520B2

(12) United States Patent
Takano

(10) Patent No.: US 10,608,520 B2
(45) Date of Patent: Mar. 31, 2020

(54) SWITCH CIRCUIT

(71) Applicant: Panasonic Intellectual Property Management Co., Ltd., Osaka (JP)

(72) Inventor: Yoh Takano, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/472,949

(22) PCT Filed: Jan. 17, 2018

(86) PCT No.: PCT/JP2018/001117
§ 371 (c)(1),
(2) Date: Jun. 24, 2019

(87) PCT Pub. No.: WO2018/150789
PCT Pub. Date: Aug. 23, 2018

(65) Prior Publication Data
US 2019/0363626 A1 Nov. 28, 2019

(30) Foreign Application Priority Data

Feb. 17, 2017 (JP) .................................. 2017-027420

(51) Int. Cl.
*H02M 1/08* (2006.01)
*H02M 7/48* (2007.01)
(Continued)

(52) U.S. Cl.
CPC ............. *H02M 1/08* (2013.01); *H02M 7/48* (2013.01); *H03K 17/08* (2013.01); *H03K 17/687* (2013.01)

(58) Field of Classification Search
CPC ............ H02M 1/08; H02M 7/48; H02M 1/00; H03K 17/687; H03K 17/08
See application file for complete search history.

(56) References Cited

U.S. PATENT DOCUMENTS 10,348,286 B2 * 7/2019 Chuang ................ H03K 17/041
10,439,514 B2 * 10/2019 Takano .................... H02M 1/08
(Continued)

FOREIGN PATENT DOCUMENTS

JP        2009-213305        9/2009

OTHER PUBLICATIONS

International Search Report of PCT application No. PCT/JP2018/001117 dated Apr. 10, 2018.

*Primary Examiner* — Kyle J Moody
(74) *Attorney, Agent, or Firm* — McDermott Will & Emery LLP

(57) ABSTRACT

A switch circuit includes a first switch connected to a first node such that the first switch is connected in series between the first node and a first electrode terminal of a DC power source. a second switch connected in series between the first node and a second node which is configured to be connected to a second electrode terminal of the DC power source, a soft switch circuit, a power switching element, and a controller. The soft switch circuit includes a capacitor connected in series between a third node and one of the first and second nodes, a charge-discharge switch connected in series between the third node and another of the first and second nodes, and a charge-discharge resistor connected in parallel to the charge-discharge switch. The power switching element has a drain terminal, a gate terminal connected to the first node, and a source terminal connected to the second node. The controller turns off the first switch, turns off the second switch, and switches the charge-discharge switch from turning off of the charge-discharge to turning on of the charge-discharge at a time point when the controller detects that a current flowing across the drain terminal and the source terminal of the power switching element is equal to or larger than a predetermined threshold while the first switch is turned on.

6 Claims, 10 Drawing Sheets

(51) Int. Cl.
*H03K 17/08* (2006.01)
*H03K 17/687* (2006.01)

(56) References Cited

U.S. PATENT DOCUMENTS

| | | | |
|---|---|---|---|
| 2012/0306545 A1* | 12/2012 | Machida | H02M 1/08 |
| | | | 327/109 |
| 2015/0222262 A1* | 8/2015 | Hanamura | H02M 7/003 |
| | | | 327/109 |
| 2016/0261266 A1* | 9/2016 | Kampl | H03K 17/165 |

* cited by examiner

SWITCH CIRCUIT

CROSS-REFERENCE TO RELATED APPLICATIONS

This application is a U.S. national stage application of the PCT international application No. PCT/JP2018/001117 filed on Jan. 17, 2018, which claims the benefit of foreign priority of Japanese patent application No. 2017-027420 filed on Feb. 17, 2017, the contents all of which are incorporated herein by reference.

TECHNICAL FIELD

The present invention relates to a switch circuit including a power switching element.

BACKGROUND ART

FIG. 8 is a circuit block diagram of conventional switch circuit 1. FIGS. 9A and 9B are timing charts illustrating an operation of conventional switch circuit 1.

In switch circuit 1, power semiconductor 3 is connected to drive circuit 2. Switch circuit 1 includes switches 5 and 6 connected to direct-current (DC) power source 4 and supplies turn-on signals and turn-off signals alternately to gate terminal 7 of power semiconductor 3. Drive circuit 2 is includes controller 8. Controller 8 inputs control signals SAA and SBB to switches 5 and 6 to turn on switch 5 and turn off switch 6, respectively, simultaneously to supplying of the turn-on signal to gate terminal 7. Controller 8 turns off switch 5 and turns on switch 6 simultaneously by similarly inputting control signals SAA and SBB to switches 5 and 6, respectively, for supplying the turn-off signal to gate terminal 7. The timing chart shown in FIG. 9A illustrates the above-described normal operation.

Gate terminal 7 is connected to switch 9 that is connected to switch 6. Switch 9 allows power semiconductor 3 to be turned off softly when an overcurrent flows through power semiconductor 3. The timing chart of FIG. 9B illustrates this operation that is a tri-state operation executed when the overcurrent is detected. The turn-on signal supplied to gate terminal 7 of power semiconductor 3 causes current Ids to flow across a drain terminal and a source terminal of power semiconductor 3. When flowing current Ids increases excessively at time point t1s for some reason, controller 8 inputs control signals SAA and SCC to switches 5 and 9 to turn off switch 5 and to turn on switch 9, respectively.

Upon being tuned on, switch 9 has a higher impedance than switches 5 and 6 which are tuned on. Power semiconductor 3 has a parasitic capacitance exists between gate terminal 7 and the source terminal thereof. When switch 5 is turned off and switch 9 is turned off due to excessive large current Ids, a charge stored in the parasitic capacitance flows through the impedance of switch 9 so as to decrease a voltage at gate terminal 7 gradually. Current Ids accordingly decreases gradually rather than steeply. This operation thus suppresses a surge voltage across the drain terminal and the source terminal by a reactance component in drive circuit 2.

A conventional switch circuit similar to switch circuit 1 is disclosed, for example, in PTL 1.

CITATION LIST

Patent Literature

PTL 1: Japanese Patent Laid-Open Publication No. 2009-213305

SUMMARY

A switch circuit includes a first switch connected to a first node such that the first switch is connected in series between the first node and a first electrode terminal of a DC power source, a second switch connected in series between the first node and a second node which is configured to be connected to a second electrode terminal of the DC power source, a soft switch circuit, a power switching element, and a controller. The soft switch circuit includes a capacitor connected in series between a third node and one of the first and second nodes, a charge-discharge switch connected in series between the third node and another of the first and second nodes, and a charge-discharge resistor connected in parallel to the charge-discharge switch. The power switching element has a drain terminal, a gate terminal connected to the first node, and a source terminal connected to the second node.

This switch circuit suppresses an overcurrent across the drain terminal and the source terminal by a simple control.

DETAIL DESCRIPTION OF PREFERRED EMBODIMENT

Figure 1:
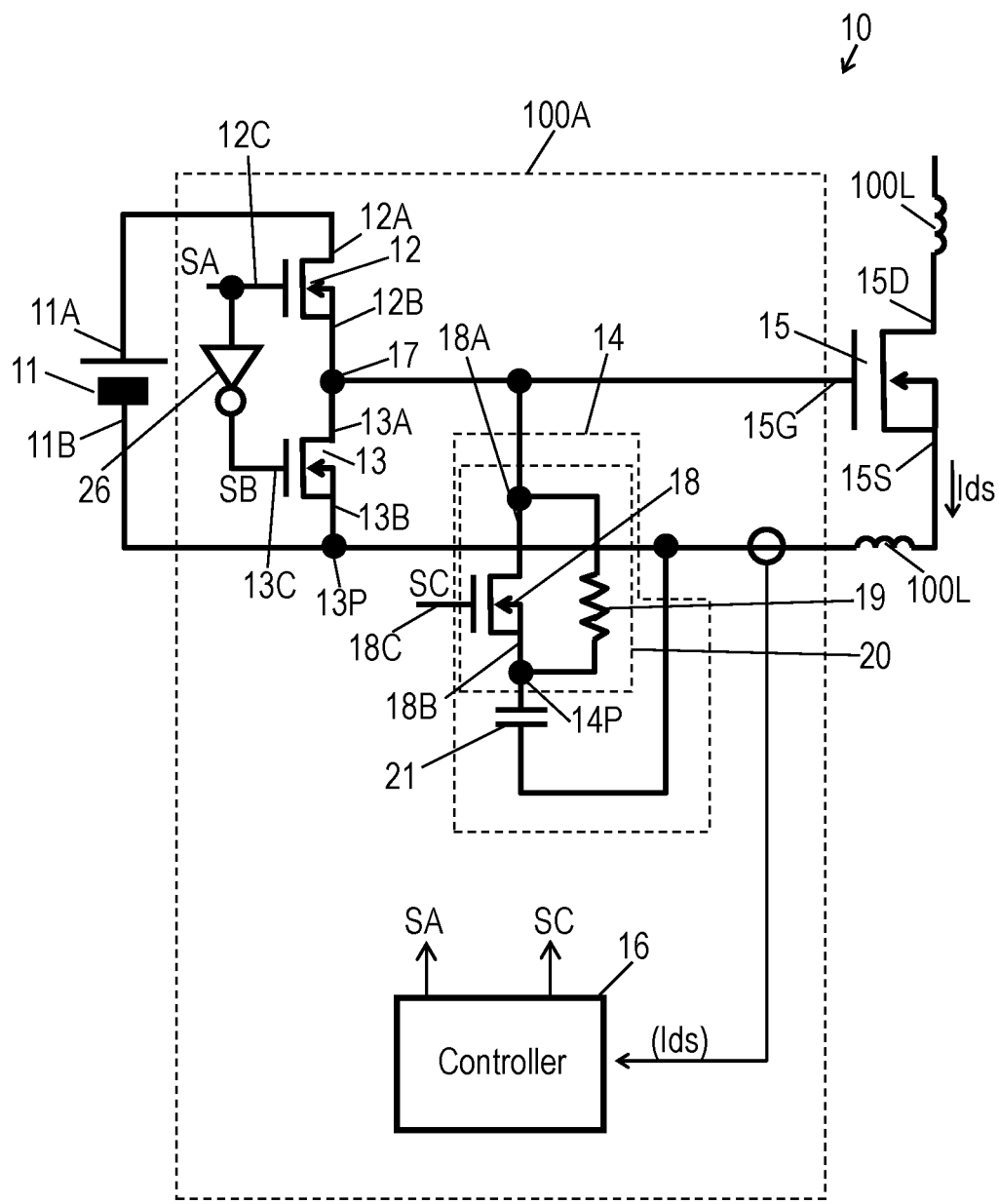
FIG. 1 is a circuit block diagram of a switch circuit according to an exemplary embodiment.

FIG. 1 is a circuit block diagram of switch circuit 10 according to an exemplary embodiment. Switch circuit 10 includes direct-current (DC) power source 11, switch 12, switch 13, soft switch circuit 14, power switching element 15, and controller 16. DC power source 11 includes electrode terminals 11A and 11B that have opposite polarities, and outputs a DC voltage across electrode terminals 11A and 11B. Switch 12, switch 13, soft switch circuit 14, and controller 16 constitute power-switching-element drive circuit 100A that drives power switching element 15. Switch circuit 10 is configured to be used with DC power source 11. DC power source 11 supplies the DC voltage across electrode terminals 11A and 11B. Switch 12 includes control port 12C and ports 12A and 12B. According to control signal SA input to control port 12C, switch 12 is turned on such that ports 12A and 12B are connected to each other, and switch 12 is turned off such that ports 12A and 12B are disconnected from each other. Similarly, switch 13 includes control port 13C and ports 13A and 13B. According to control signal SB input to control port 13C, switch 13 is turned on such that ports 13A and 13B are connected to each other, and switch 13 is turned off such that ports 13A and 13B are disconnected from each other. In switch circuit 10 shown in FIG. 1, power switching element 15 is an N-channel power metal-oxide-semiconductor field-effect transistor (MOSFET). Electrode terminal 11A of DC power source 11 is a positive electrode while electrode terminal 11B is a negative electrode. This means that DC power source 11 supplies the DC voltage across electrode terminals 11A and 11B so that electrode terminal 11A has a higher potential than electrode terminal 11B.

Port 12A of switch 12 is connected to electrode terminal 11A of DC power source 11. Port 13B of switch 13 is connected to node 13P that is connected to electrode terminal 11B of DC power source 11. In switch circuit 10 shown in FIG. 1, switch 12 connected to positive electrode terminal 11A of DC power source 11 functions as a positive-side switch while switch 13 connected to negative electrode terminal 11B functions as a negative-side switch. Port 12B of switch 12 is connected to port 13A of switch 13 at node 17. Soft switch circuit 14 is connected to node 17 and node 13P. Soft switch circuit 14 includes parallel assembly 20 and capacitor 21 connected in series to parallel assembly 20. Parallel assembly 20 includes charge-discharge switch 18 and charge-discharge resistor 19 that are connected in parallel to each other. Parallel 20 assembly is connected to node 17. Capacitor 21 is connected to node 13P, which is connected to electrode terminal 11B of DC power source 11. Power switching element 15 has drain terminal 15D, gate terminal 15G, and source terminal 15S. Gate terminal 15G is connected to node 17. Source terminal 15S is connected to node 13P, connected to electrode terminal 11B of DC power source 11. Controller 16 detects current Ids that flows across drain terminal 15D and source terminal 15S of power switching element 15, and directly or indirectly controls an operation of the switches via control port 12C of switch 12, control port 13C of switch 13, and control port 18C of charge-discharge switch 18.

In soft switch circuit 14, parallel assembly 20 is connected in series to capacitor 21. Parallel assembly 20 and capacitor 21 may be reversed. This means that parallel 20 may be connected to node 13P connected to electrode terminal 11B of DC power source 11 while capacitor 21 may be connected to node 17. Thus, in soft switch circuit 14, capacitor 21 is connected in series between node 14P and one of nodes 13P and 17. Charge-discharge switch 18 is connected in series between node 14P and another of nodes 13P and 17. Charge-discharge resistor 19 is connected in parallel to charge-discharge switch 18.

In a normal operation, controller 16 repetitively executes a first control and repetitively executes a second control. The first control is a control of switches 12 and 13 in which controller 16 turns on and off switches 12 and 13 complementarily. The second control is a control of charge-discharge switch 18 in which controller 16 switches charge-discharge switch 18 from turning off of switch 18 to turning on of switch 18 at a lapse of a predetermined time period from a time point when controller 16 switches switch 13 from turning off of switch 13 to turning on of switch 13 in the first control. Controller 16 switches charge-discharge switch 18 from turning on of switch 18 to turning off of switch 18 simultaneously when controller 16 switches switch 13 from turning on of switch 13 to turning off of switch 13 in the first control.

Controller 16 operates as follows when an overcurrent is detected as an abnormality. Controller 16 turns off switch 12, turns on switch 13, and switches charge-discharge switch 18 from turning off of switch 18 to turning on of switch 18 at a time point when controller 16 detects that current Ids is equal to or larger than a predetermined threshold while switch 12 is turned on, for example, when an inrush current flows through power switching element 15.

With the above configuration and the above operation, voltage Vgs across gate terminal 15G and source terminal 15S shifts from a pulled-up state in which voltage Vgs is connected to electrode terminal 11A to a pulled-down in which voltage Vgs is connected to electrode terminal 11B. This configuration releases a charge stored in capacitor 21, so that the voltage Vgs applied to gate terminal 15G of power switching element 15 decreases gradually from a high level to a lower level lower than the high level. Current Ids flowing through power switching element 15 accordingly decreases gradually.

While maintaining such a simple control that switches 12 and 13 always operate complementarily, the switch circuit suppresses excessive current Ids flowing through power switching element 15 and a surge voltage generated across reactance component 100L due to a sudden change in current Ids. Consequently, the switch circuit suppresses an overvoltage applied to power switching element 15, thereby providing power switching element 15 with high reliability and a longer life.

Figure 2:
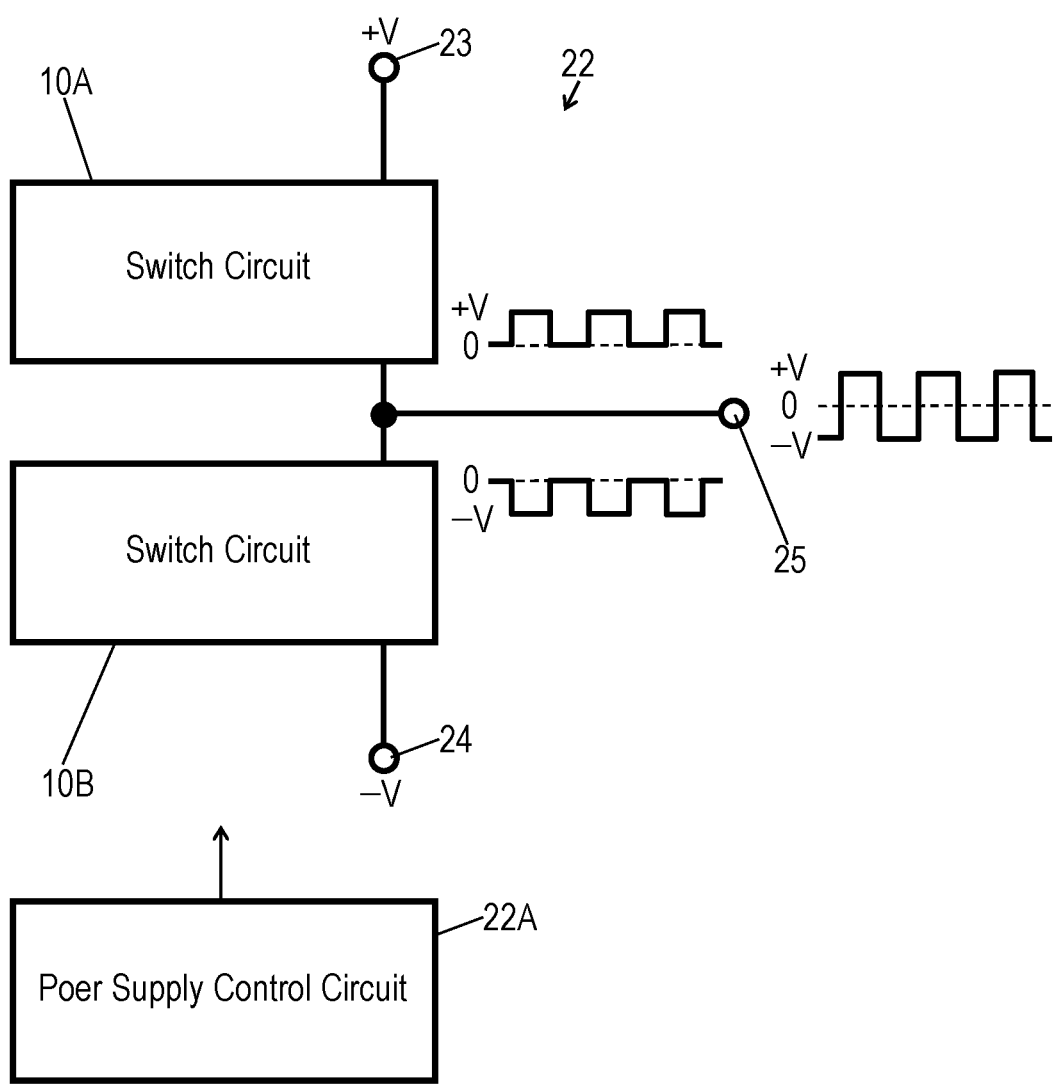
FIG. 2 is a circuit block diagram of an inverter circuit including the switch circuit according the embodiment.

The configuration and operation of switch circuit 10 will be detailed below. FIG. 2 is a circuit block diagram of inverter circuit 22 including switch circuits 10.

Inverter circuit 22 includes positive-side power supply unit 23, negative-side power supply unit 24, pulse waveform output unit 25, upper-arm switch circuit 10A provided between positive-side power supply unit 23 and pulse waveform output unit 25, and lower-arm switch circuit 10B provided between negative-side power supply unit 24 and pulse waveform output unit 25. Each of switch circuits 10A and 10B has the same configuration as switch circuit 10 shown in FIG. 1. Switch circuit 10A outputs voltages +V to pulse waveform output unit 25 based on a duty of upper-arm power switching element 15. Switch circuit 10B outputs voltages −V to pulse waveform output unit 25 based on a duty of lower arm power switching element 15. Voltage +V and voltage −V are alternately output as an alternating-current voltage from pulse waveform output unit 25.

Switch circuits 10A and 10B have the same configuration and operate similarly, except that their timings of operation are in reverse relationship, and polarities of their output voltages are in reverse relationship. Power supply control circuit 22A is connected to both switch circuits 10A and 10B to control the timing of operations of switch circuits 10A and 10B and the above-described duty of each of power switching elements 15.

Figure 3:
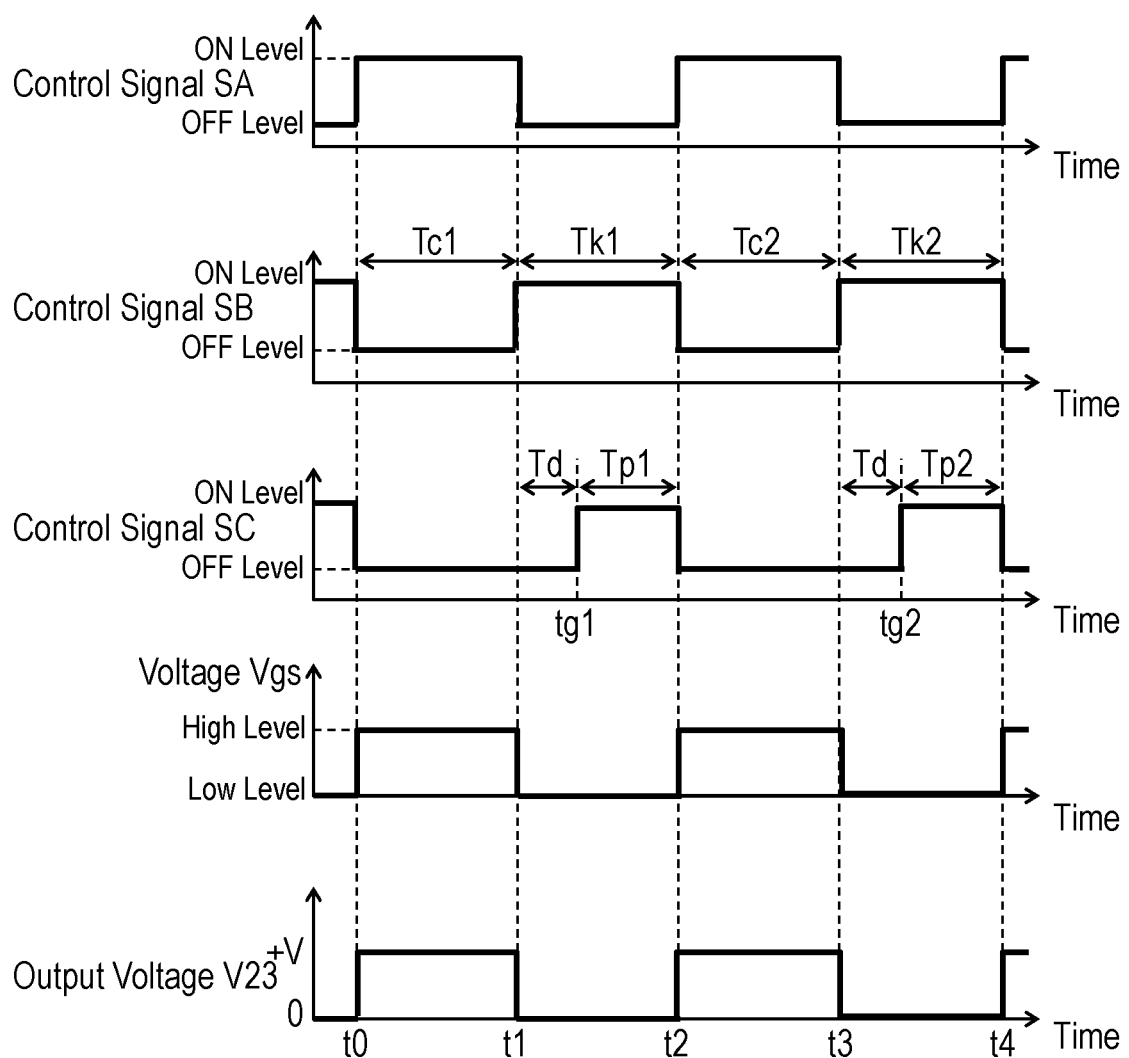
FIG. 3 illustrates a normal operation of the switch circuit according to the embodiment.

The above operation will be described below. FIG. 3 is a timing chart illustrating a normal operation of switch circuit 10A (10) illustrated in FIG. 2.

FIG. 3 illustrates control signal SA input to control port 12C of switch 12, control signal SB input to control port 13C of switch 13, control signal SC input to control port 18C of charge-discharge switch 18, voltage Vgs across gate terminal 15G and source terminal 15S of power switching element 15, and output voltage V23 of switch circuit 10A (10). In FIG. 3, vertical axes represent control signals SA, SB, and SC, voltage Vgs, and output voltage V23 while horizontal axes represent time. In accordance with the embodiment, output voltage V23 is a voltage at drain terminal 15D of power switching element 15. When control signal SA is at an ON-level, ports 12A and 12B of switch 12 are connected to each other to turn on switch 12. When control signal SA is at an OFF-level, ports 12A and 12B of switch 12 are disconnected from each other to turn off switch 12. When control signal SB is at an ON-level, ports 13A and 13B of switch 13 are connected to each other to turn on switch 13. When control signal SB is at an OFF-level, ports 13A and 13B of switch 13 are disconnected from each other to turn off switch 13. When control signal SC is at an ON-level, ports 18A and 18B of charge-discharge switch 18 are connected to each other to turn on charge-discharge switch 18. When control signal SC is at an OFF-level, ports 18A and 18B of charge-discharge switch 18 are disconnected from each other to turn off charge-discharge switch 18. Voltage Vgs is switched between a high level for connecting drain terminal 15D to source terminal 15S to turn on power switching element 15 and a low level for disconnecting drain terminal 15D from source terminal 15S to turn off power switching element 15.

The normal operation of switch circuit 10 will be described first below. In the normal operation, current Ids flowing across drain terminal 15D and source terminal 15S is smaller than predetermined threshold Is, that is, no overcurrent flows through power switching element 15. Controller 16 executes the normal operation in which controller 16 repetitively executes the second control while repetitively executing the first control.

The first control is a control of switches 12 and 13 in which switches 12 and 13 are turned on and off alternately. In other words, switch 13 is turned off while switch 12 is turned on. Switch 13 is turned on while switch 12 is turned off. Controller 16 turns on and off switches 12 and 13 complementarily. Control port 12C of switch 12 is connected to control port 13C of switch 13 via signal inverter 26. In switch circuit 10 of the embodiment shown in FIG. 1, signal inverter 26 inverts the ON and OFF levels of control signal SA input to control port 12C of switch 12, so that the inverted control signal SA is input as control signal SB to control port 13C of switch 13. Signal inverter 26 may invert the ON and OFF levels of control signal SB input to control port 13C of switch 13 so that the inverted control signal SB is input as control signal SA to control port 12C of switch 12. Specifically, controller 16 turns on switch 12 and turns off switch 13 at time point t0. Then, controller 16 continuously turns on switch 12 and continuously turns off switch 13 during time period Tc1 from time point t0 to time point t1. Controller 16 turns off switch 12 and turns on switch 13 at time point t1. Then, controller continuously turns off switch 12 and turns on 13 during time period Tk1 from time point t1 and time point t2. Controller 16 turns on switch 12 and turns off switch 13 at time point t2. Then, controller 16 continuously turns on switch 12 and continuously turns off switch 13 during time period Tc2 from time point t2 to time point t3. Controller 16 turns off switch 12 and turns on switch 13 at time point t3. Then, controller 16 continuously turns off switch 12 and continuously turns on switch 13 during time period Tk2 from time point t3 to time point t4. At time point t4 and thereafter, similarly, controller 16 alternately turns on and off switches 12 and 13 complementarily. Controller 16 inputs the single control signal to only one of control ports 12C and 13C to perform the first control.

The second control is a control of charge-discharge switch 18. Controller 16 continuously turns off charge-discharge switch 18 during time period Tc1 (Tc2) in which switch 12 is turned on and switch 13 is turned off in the above first control. Controller 16 switches charge-discharge switch 18 from turning off of switch 18 to turning on of switch 18 at time point tg1 (tg2) at a lapse of predetermined time period Td from time point t1 (t3) at which switch 13 is switched from turning off of switch 13 to turning on of switch 13 in the first control. At subsequent time point t2 (t4), controller 16 switches switch 13 from turning on of switch 13 to turning off of switch 13 and switches charge-discharge switch 18 from turning on of switch 18 to turning off of switch 18 simultaneously to the switching of switch 13. At the time point t2 (t4) at a lapse of predetermined time period Tp1 (Tp2) from the time point tg1 (tg2) at which charge-discharge switch 18 is switched from turning off of switch 18p to turning on of switch 18, controller 16 switches switch 13 from turning on of switch 13 to turning off of switch 13 and switches charge-discharge switch 18 from turning on of switch 18 to turning off of switch 18 simultaneously to the switching of switch 13. During time period Tk1 (Tk2) that is a total of time periods Td and Tp1 (Tp2), switch 13 is continuously turned on, and switch 12 is continuously turned off. During time period Tc1 (Tc2), switch 12 is continuously turned on, and switch 13 is continuously turned off.

During time period Tc1 (Tc2), the voltage applied to gate terminal 15G of power switching element 15 is pulled up, thus connecting drain terminal 15D to source terminal 15S of power switching element 15.

Charge-discharge switch 18 is turned off during this time period, so that capacitor 21 is charged through charge-discharge resistor 19.

During next time period Td, the voltage applied to gate terminal 15G of power switching element 15 is pulled down, thus disconnecting drain terminal 15D from source terminal 15S of power switching element 15. Charge-discharge switch 18 is turned off during this time period, so that capacitor 21 is discharged through charge-discharge resistor 19.

During subsequent time period Tp1 (Tp2), the voltage applied to gate terminal 15G of power switching element 15 is pulled down, thus continuously disconnecting drain terminal 15D from source terminal 15S of power switching element 15. Charge-discharge switch 18 is turned on during time period Tp1 (Tp2), and capacitor 21 is not almost charged during time period Td.

The length of time period Td may be adjusted based on the resistance of charge-discharge resistor 19. While time period Td increases as the resistance of charge-discharge resistor 19 increases, time period Td is shorter than time period Tk1 (Tk2) during which switch 13 is turned on. By adjustment of the value of charge-discharge resistor 19 allows time period Td to be shorter than time period Tp1 (Tp2).

During time period Tp1 (Tp2), charge-discharge switch 18 is turned on, so that capacitor 21 is connected in parallel to a parasitic capacitance between gate terminal 15G and source terminal 15S of power switching element 15. During time period Tp1 (Tp2) in which switch 13 is turned on and power switching element 15 is turned on and charge-discharge switch 18 is turned on, a large capacitance including the parasitic capacitance and capacitor 21 that are connected in parallel to each other is connected between gate terminal 15G and source terminal 15S, so that power switching element 15 is hardly turned on even when external burst noise enters into gate terminal 15G of power switching element 15.

Controller 16 repetitively execute the above-described first and second controls based on a duty which is a ratio of time period Tc1 (Tc2) to time period Tk1 (Tk2) that corresponds to the output voltage of pulse waveform output unit 25.

Unless controller 16 detects that current Ids is equal to or larger than predetermined threshold Is while switch 12 is turned on, controller 16 repetitively the first and second controls. Unless controller 16 detects that current Ids is equal to or larger than predetermined threshold Is while switch 12 is turned on, controller 16 continuously turns off charge-discharge switch 18 at time point t3 when the controller switches switch 13 from turning off of switch 13 to turning on of switch 13 in the first control. In other words, controller 16 continuously turns off charge-discharge switch 18 from time point t0 to time point tg1, and continuously turns off charge-discharge switch 18 from time point t2 to time point tg2.

The first and second controls repetitively executed by controller 16 in the normal operation have been described. An operation of the switch circuit 10 due the current Ids flowing through power switching element 15 and detected by controller 16 being excessively large or an overcurrent will be described below. In this case, current Ids flowing across drain terminal 15D and source terminal 15S of power switching element 15 exceeds predetermined threshold Is.

Figure 4:
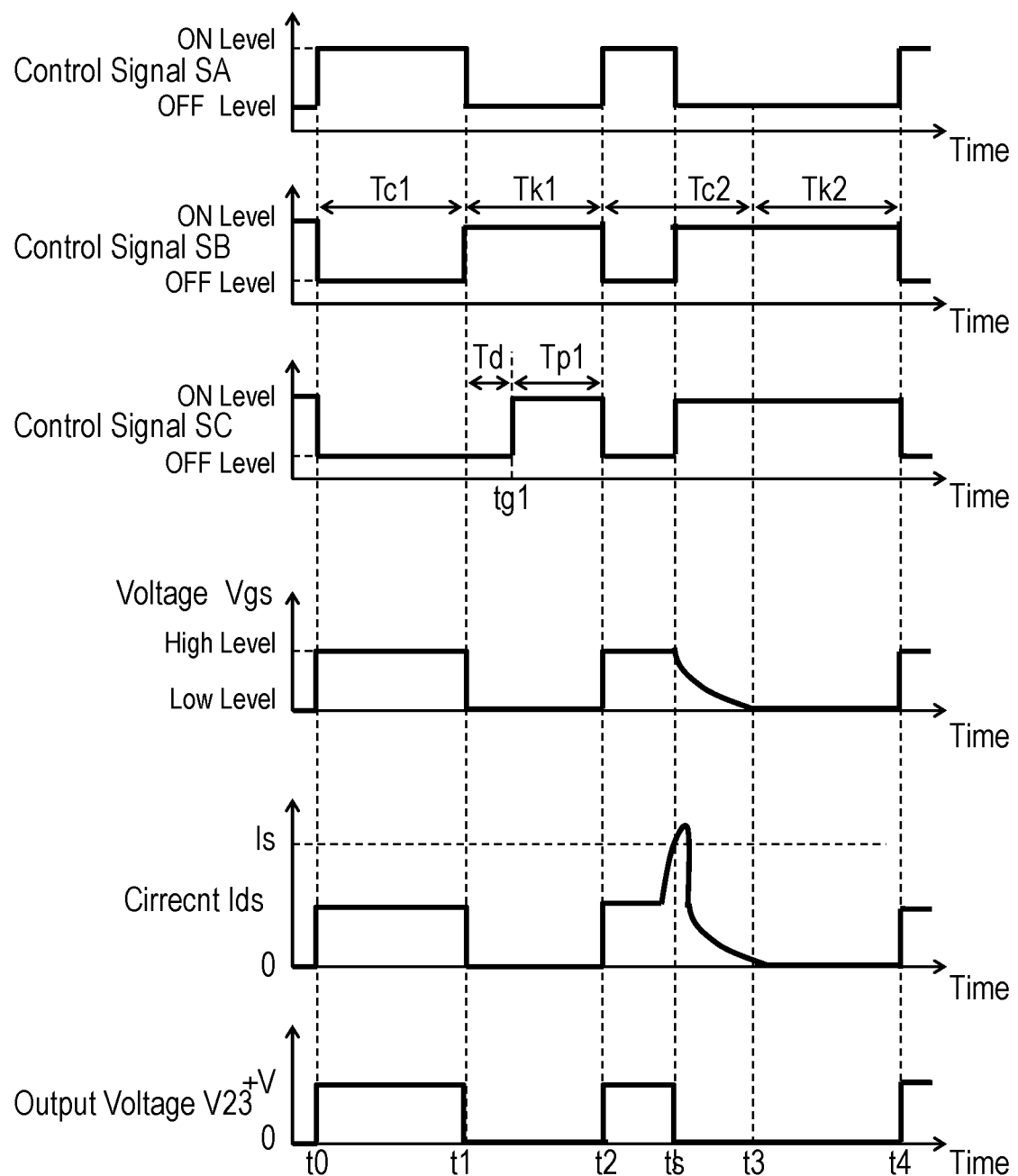
FIG. 4 illustrates an operation of the switch circuit according to the embodiment when an overcurrent is detected.

FIG. 4 is a timing chart illustrating the operation of switch circuit 10 when the overcurrent is detected. In FIG. 4, items similar to those of FIG. 3 are denoted by the same reference numerals. FIG. 4 also illustrates current Ids that flows across drain terminal 15D and source terminal 15S of power switching element 15.

In the operation shown in FIG. 4, controller 16 detects current Ids exceeding threshold Is at time point ts. Until time point ts, controller 16 repetitively executes the above-described first and second controls based on the duty corresponding to the output voltage of pulse waveform output unit 25.

Upon detecting that current Ids exceeds threshold Is at time point ts, controller 16 switches switch 12 from turning on of switch 12 turning on power switching element 15 to turning off of switch 12, and switches switch 13 from turning off of switch 13 to turning on of switch 13 simultaneously at time point ts. Controller 16 also switches charge-discharge switch 18 from turning off of switch 18 to turning on of switch 18 at time point ts.

Until time point ts, switch 12 is turned on and charge-discharge switch 18 is turned off, so that capacitor 21 is charged. Time period Tf to a time point when capacitor 21 is fully or almost fully charged for later discharge from the time point of switching of switch 12 from turning off to turning on is determined by the resistance of charge-discharge resistor 19 and the capacitance of capacitor 21. Time period Tf may be determined by above-mentioned time periods Td and Tp1 (Tp2). Time period Tf is shorter than time period Tc1 (Tc2). Capacitor 21 is fully or almost fully charged at time point ts.

At time point ts when capacitor 21 is fully or almost fully charged, controller 16 switched switch 12 from turning on of switch 12 to turning off of switch 12, and switches switch 13 from turning off of switch 13 to turning on of switch 13, and also switches charge-discharge switch 18 from turning off of switch 18 to turning on of switch 19 so as to provide the pull-down state. Since above-mentioned time period Td does not exist immediately before time point ts, there is no discharge period during which capacitor 21 is discharged. Capacitor 21 which is charged until time point ts to have the voltage in or near the pull-up state starts to be discharged at time point ts. A voltage across discharging capacitor 21 is applied as voltage Vgs across gate terminal 15G and source terminal 15S of power switching element 15. In other words, the switching of voltage Vgs between the high level and the low level is synchronous with the switching of switch 12 between the turning on and off until time point ts, but is not fully synchronous after time point ts.

During the releasing of the charge stored in capacitor 21, charge-discharge switch 18 connected between capacitor 21 and power switching element 15 is turned on. That is, capacitor 21 is connected in parallel to the parasitic capacitance between gate terminal 15G and source terminal 15S of power switching element 15. Accordingly, voltage Vgs applied to gate terminal 15G of power switching element 15 decreases from the high level to the low level not immediately, but gradually decreases. Switch 12 is not completely synchronous with voltage Vgs after time point ts. In association with this, current Ids flowing across drain terminal 15D and source terminal 15S of power switching element 15 accordingly decreases gradually from a value exceeding threshold Is. The gradual decrease of current Ids flowing across drain terminal 15D and source terminal 15S of power switching element 15 suppresses a surge voltage which is generated, due to a sudden change in current Ids, across reactance component 100L in the circuit in which current Ids flows.

Figure 8:
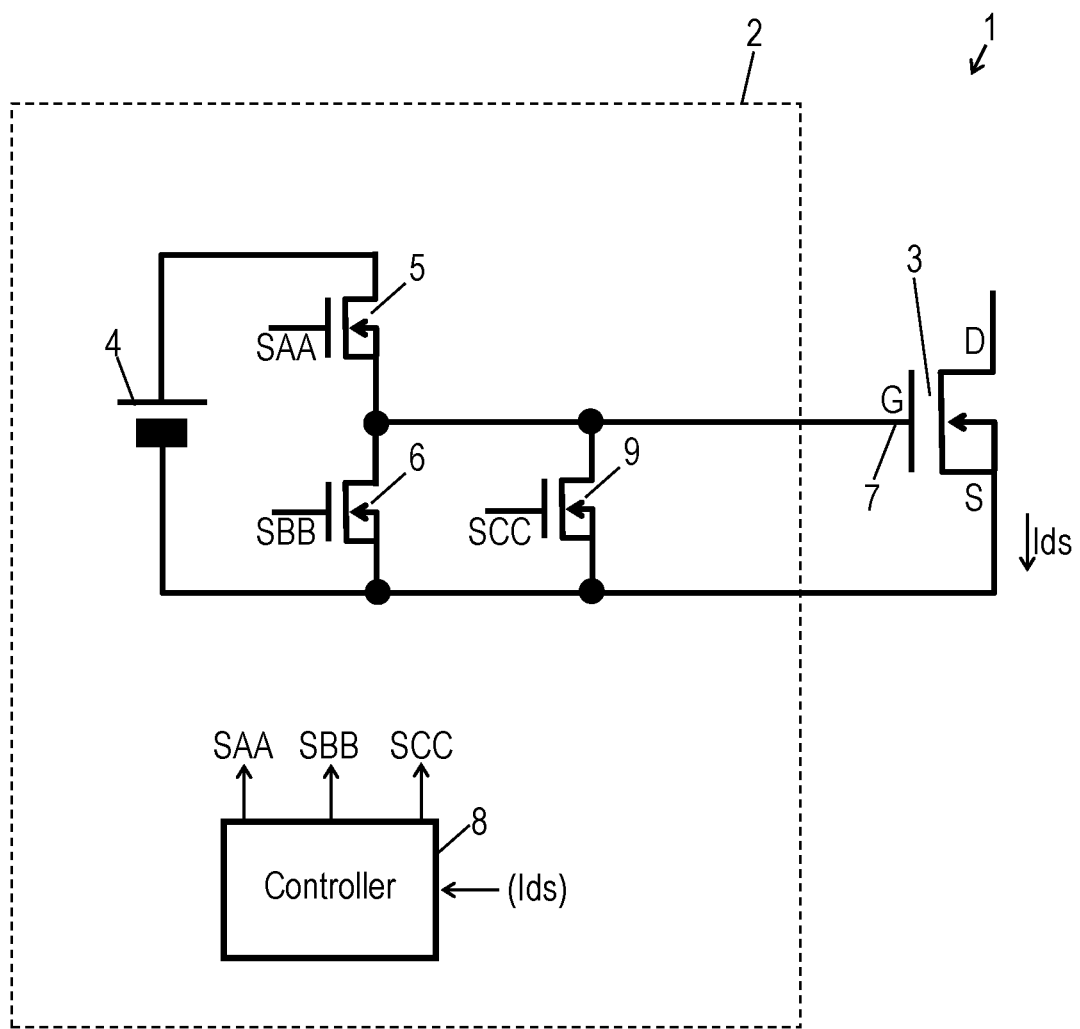
FIG. 8 is a circuit block diagram of a conventional switch circuit.
Figure 9A:
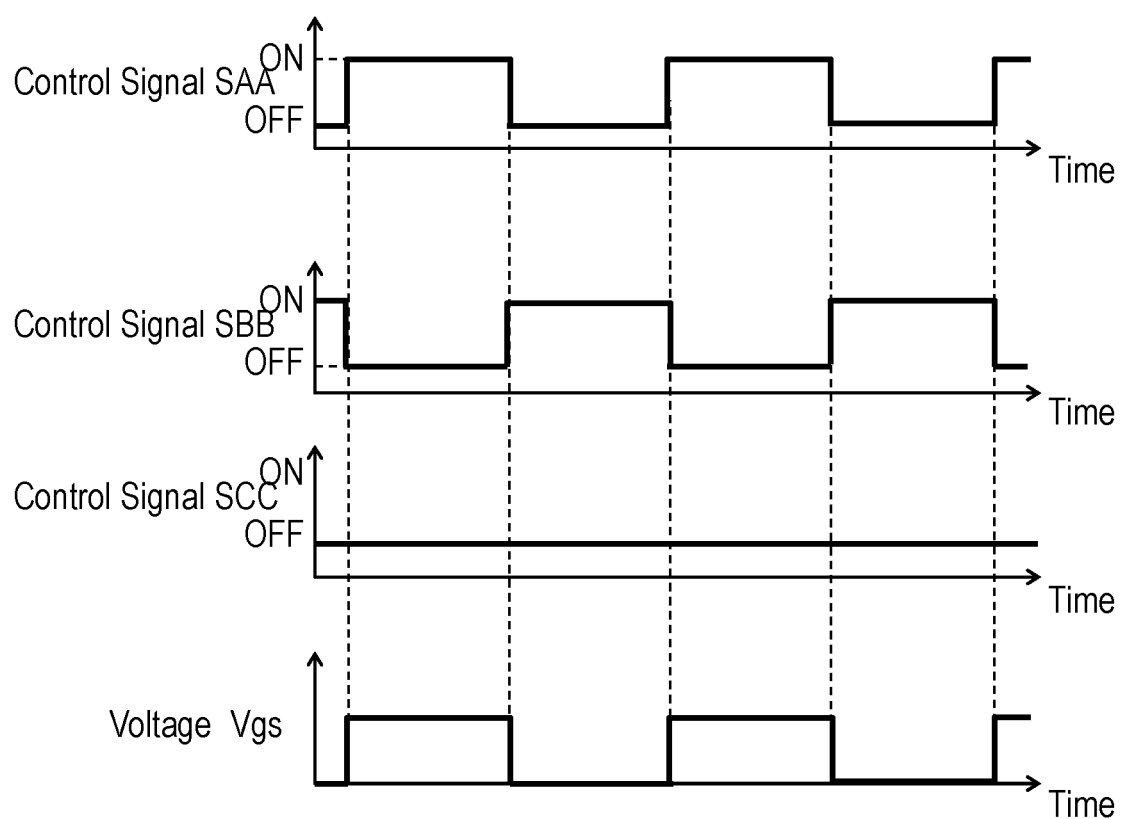
FIG. 9A illustrates an operation of the conventional switch circuit.
Figure 9B:
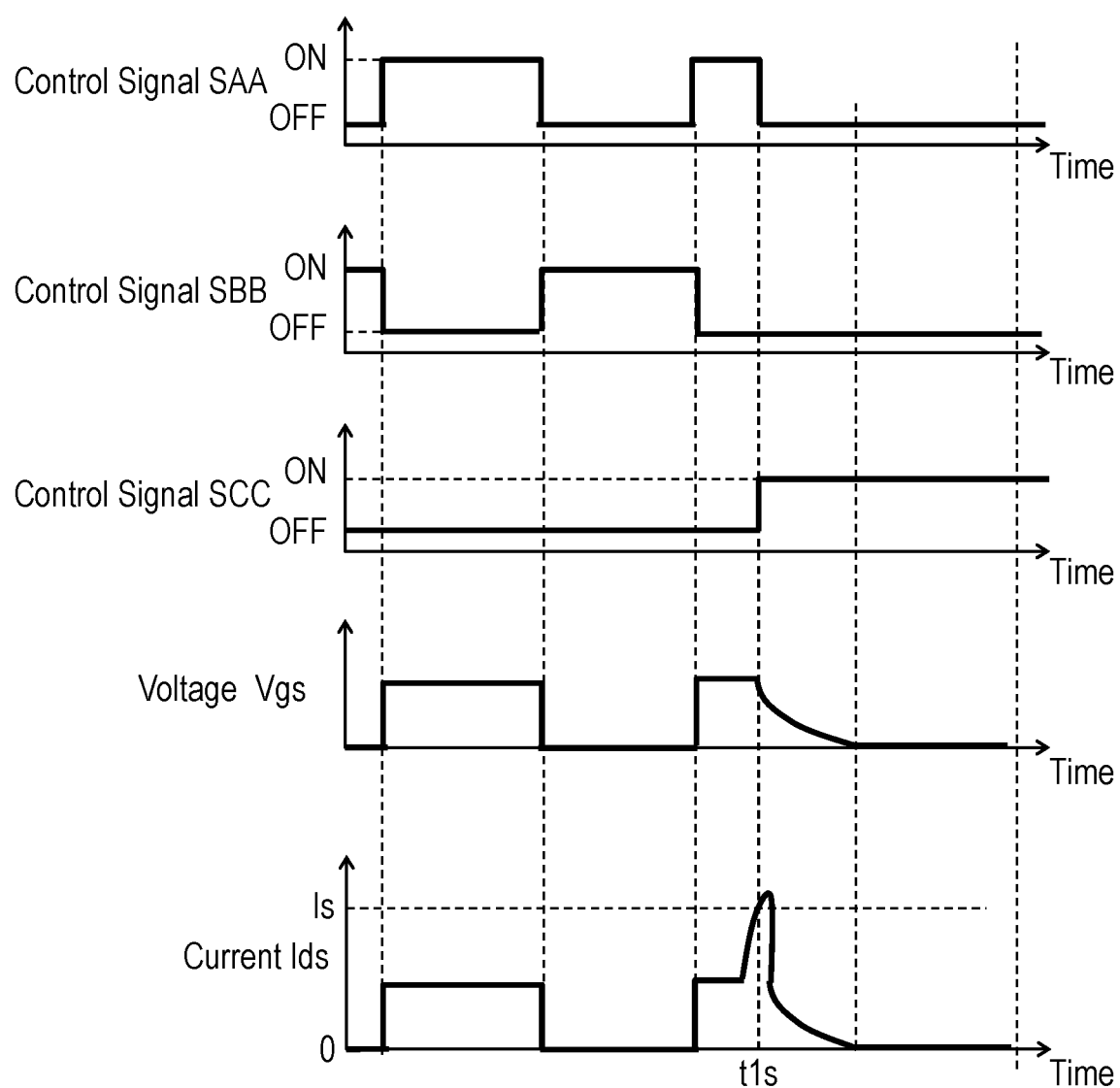
FIG. 9B illustrates an operation of the conventional switch circuit.

In conventional switch circuit 1 illustrated in FIG. 8, controller 8 is required to perform complicated control of three operations: an operation to turn on switch 5, turn off switch 6, and turn off switch 9, an operation to turn off switch 5, turn on switch 6, and turn off switch 9, and a further operation to turn off switches 5 and 6 and turn on switch 9 to suppress sudden cutoff of current Ids flowing across the drain terminal and the source terminal of power semiconductor 3.

In switch circuit 10 according to the embodiment, due to the above configuration and operations, the simple first control in which switches 12 and 13 are always switched complementarily suppresses such an overcurrent that current Ids flowing across drain terminal 15D and source terminal 15S of power switching element 15 excessively increases and suppresses a surge voltage that produced due to a sudden change in current Ids.

Consequently, an overvoltage applied to power switching element 15 is suppressed, and power switching element 15 can maintain the high reliability and the longer life.

As described above, switches 12 and 13 are controlled to always operate complementarily, and upper-arm switch circuit 10A and lower-arm switch circuit 10B illustrated in FIG. 2 alternately output the voltages. As such, upper-arm switch circuit 10A and lower-arm switch circuit 10B are controlled easily with a single clock signal.

In the above operation, when controller 16 detects the overcurrent at time point ts, voltage Vgs being to gate terminal 15G of power switching element 15 starts to be pulled down while decreasing gradually. After time point ts, controller 16 may maintain voltage Vgs that has been pulled down at the high level. Another alternative is that controller 16 may pull up voltage Vgs to the high level again at time point t5, that is, after a lapse of a predetermined time period from time point ts.

In cases where voltage Vgs is pulled up again, time point t5 corresponds to time point t0 shown in each of FIGS. 3 and 4, and at time point t5 and thereafter, controller 16 repetitively the above-mentioned first and second controls again.

In switch circuit 10 shown in FIG. 1, DC power source 11 and controller 16 are each disposed independently in switch circuit 10 for convenience of explanation. However, DC power source 11 may be shared with another circuit, and controller 16 may control both upper-arm switch circuit 10A and lower-arm switch circuit 10B illustrated in FIG. 2.

Moreover, controller 16 may be provided as a part of a control circuit that controls an overall power supply circuit including switch circuit 10.

Figure 5:
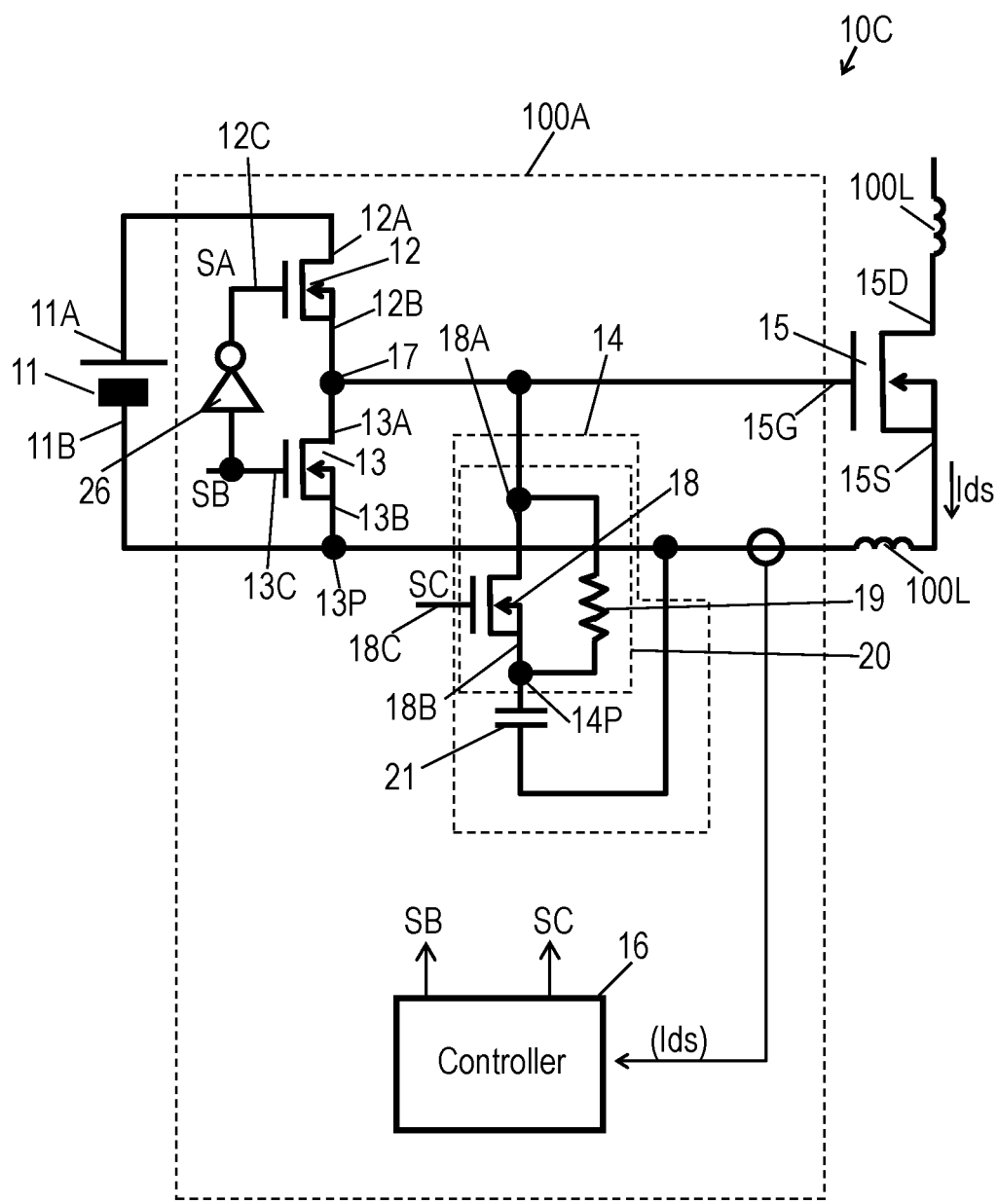
FIG. 5 is a circuit block diagram of another switch circuit according to the embodiment.

FIG. 5 is a circuit block diagram of another switch circuit 10C according to the embodiment. In FIG. 5, components identical to those of switch circuit 10 shown in FIG. 1 are denoted by the same reference numerals. In switch circuit 10C, an input port and an output port of signal inverter 26 switch circuit 10 shown in FIG. 1 are replaced with each other, and controller 16 outputs control signal SB input to control port 13C of switch 13 in place of control signal SA. Signal inverter 26 inverts control signal SB to generate control signal SA and outputs control signal SA to control port 12C of switch 12. Switch circuit 10C operates similarly to switch circuit 10 shown in FIG. 1 and provides the same effects.

Figure 6:
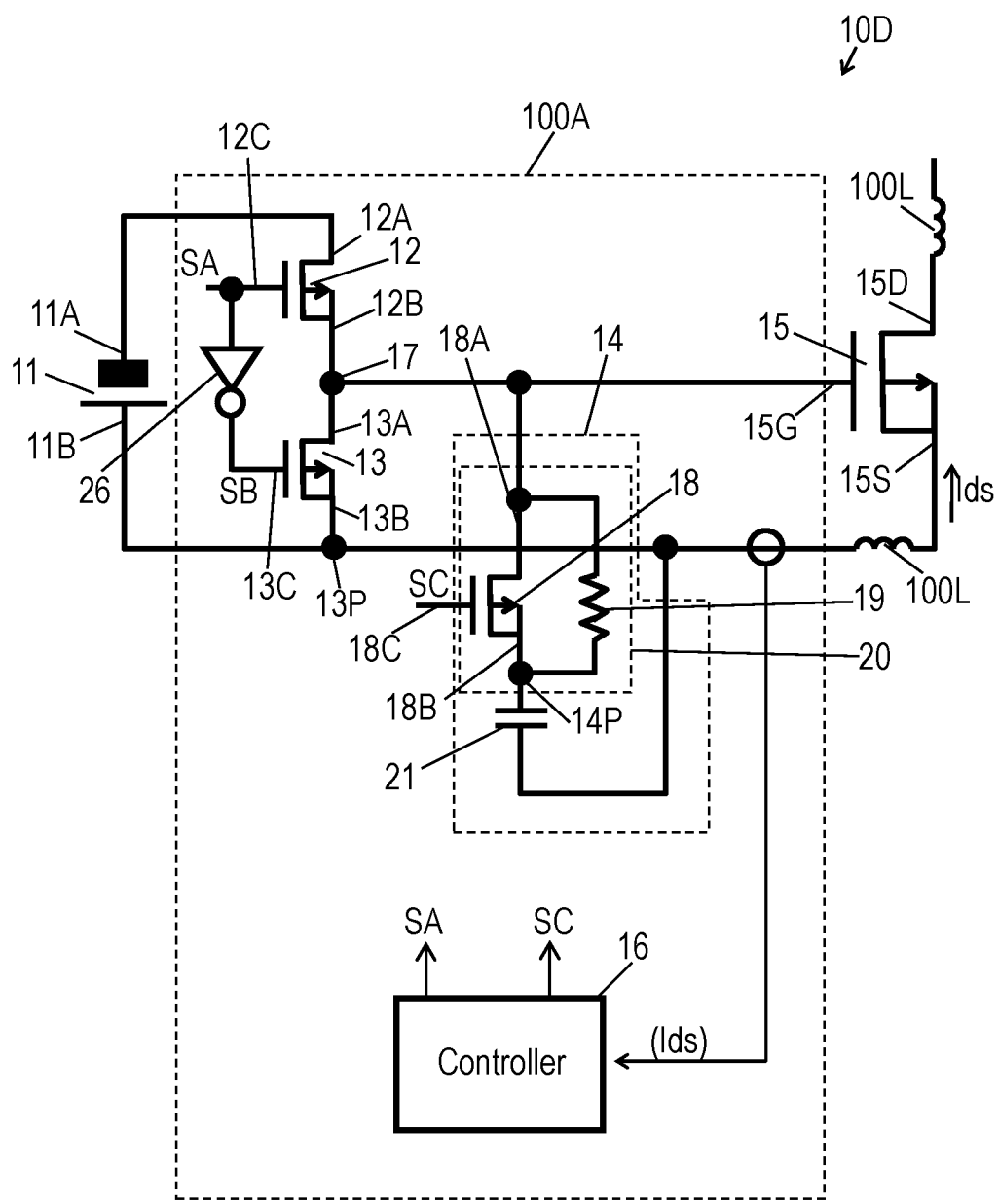
FIG. 6 is a circuit block diagram of still another switch circuit according to embodiment.

FIG. 6 is a circuit block diagram of still another switch circuit 10D according to the embodiment. In FIG. 6, components identical to those of switch circuit 10 shown in FIG. 1 are denoted by the same reference numerals. In switch circuit 10D shown in FIG. 6, power switching element 15 is a P-channel power MOSFET. Electrode terminal 11A of DC power source 11 is a negative electrode while electrode terminal 11B is a positive electrode. DC power source 11 thus supplies a DC voltage across electrode terminals 11A and 11B so that electrode terminal 11B has a higher potential than electrode terminal 11A. In switch circuit 10D shown in FIG. 6, switch 12 connected to negative electrode terminal 11A of DC power source 11 functions as a negative-side switch while switch 13 connected to positive electrode terminal 11B functions as a positive-side switch. Although polarity of voltage Vgs is reversed as compared to voltage Vgs illustrated in FIGS. 3 and 4, switch circuit 10D operates similarly to switch circuit 10 shown in FIG. 1 and provides the same effects.

Figure 7:
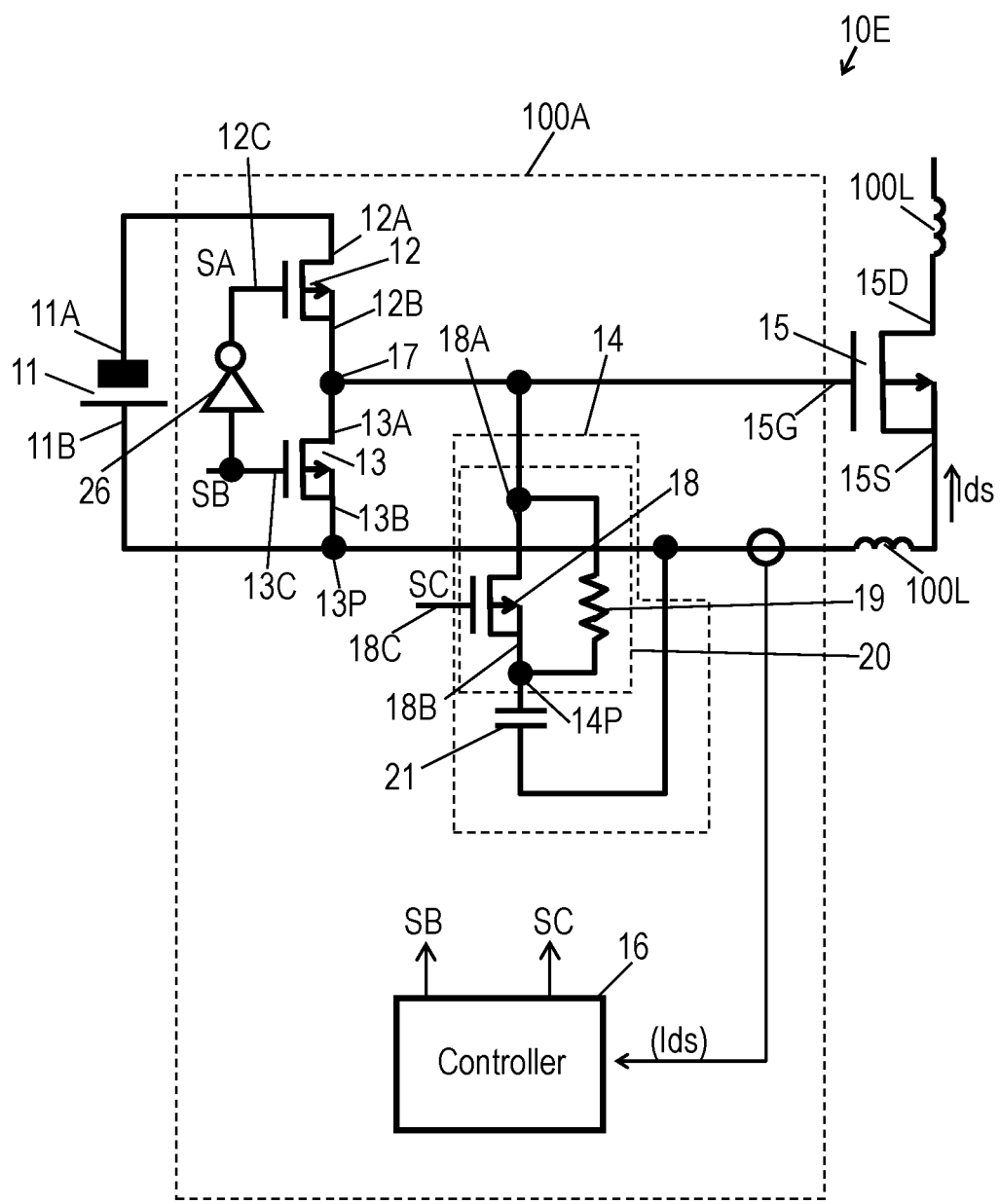
FIG. 7 is a circuit block diagram of a further switch circuit according to the embodiment.

FIG. 7 is a circuit block diagram of further switch circuit 10E according to the embodiment. In FIG. 7, components identical to those of switch circuit 10D shown in FIG. 6 are denoted by the same reference numerals. In switch circuit 10E, an input port and an output port of signal inverter 26 are reversed as compared to switch circuit 10D shown in FIG. 6, and controller 16 outputs control signal SB input to control port 13C of switch 13 in place of control signal SA. Signal inverter 26 inverts control signal SB to generate control signal SA and outputs control signal SA to control port 12C of switch 12. Switch circuit 10E operates similarly to switch circuit 10D shown in FIG. 6 and provides the same effects.

As described above, switch circuit 10 is configured to be used with DC power source 11 that includes electrode terminals 11A and 11B. In switch circuit 10, switch 12 is connected to node 17 to be connected in series between node 17 and electrode terminal 11A of DC power source 11. Switch 13 is connected in series between node 17 and node 13P that is connected to electrode terminal 11B of DC power source 11. Capacitor 21 is connected in series between node 14P and one of nodes 13P and 17. Charge-discharge switch 18 is connected in series between node 14P and another of nodes 13P and 17. Charge-discharge resistor 19 is connected in parallel to charge-discharge switch 18. Power switching element 15 includes drain terminal 15D, gate terminal 15G connected to node 17, and source terminal 15S connected to node 13P. Controller 16 detects current Ids flowing across drain terminal 15D and source terminal 15S of power switching element 15. Controller 16 repetitively executes the first control in which controller 16 turns on switch 12 and turns off switch 13 simultaneously to the turning on of switch 12, and then, turns off switch 12 and turns on switch 13 simultaneously to the turning off of switch 12. Controller 16 repetitively executes the second control in which controller 16 switches charge-discharge switch 18 from turning off of switch 18 to turning on of switch 18 at time point tg2 after the lapse of predetermined time period Td from time point t3 when controller 16 switches switch 13 from turning off of switch 13 to turning on of switch 13 in the first control, and then controller 16 switches charge-discharge switch 18 from turning on of switch 18 to turning off of switch 18 simultaneously when controller 16 switches switch 13 from turning on of switch 13 to turning off of switch 13 in the first control. Controller 16 turns off switch 12, turns on switch 13, and switches charge-discharge switch 18 from turning off of switch 18 to turning position switch 18 at time point ts when controller 16 detects that current Ids is equal to or larger than predetermined threshold Is while switch 12 is turned on.

Signal inverter 26 may be connected between control ports 12C and 13C. In this case, controller 16 inputs the single control signal to only one of control ports 12C and 13C to execute the first control.

Unless controller 16 detects that current Ids is equal to or larger than predetermined threshold Is while switch 12 is turned on, controller 16 may repetitively executes the first control and repetitively executes the second control.

Unless controller 61 detects that current Ids is equal to or larger than predetermined threshold Is while switch 12 is turned on, controller 16 may continuously turns off charge-discharge switch 18 at time point t3 when controller 16 switches switch 13 from turning off of switch 13 to turning on of switch 13 in the first control.

REFERENCE MARKS IN THE DRAWINGS

10 switch circuit
11 DC power source
12 switch (first switch)
12C control port (first control port)
13 switch (second switch)
13C control port (second control port)
13P node (second node)
14 soft switch circuit
14P node (third node)
15 power switching element
16 controller
17 node (first node)
18 charge-discharge switch
19 charge-discharge resistor
20 parallel
21 capacitor
22 inverter circuit
23 positive-side power supply unit
24 negative-side power supply unit
25 pulse waveform output unit
26 signal inverter

The invention claimed is:
1. A switch circuit configured to be used with a direct-current (DC) power source including a first electrode terminal and a second electrode terminal that have opposite polarities, the switch circuit comprising:
a first switch connected to a first node such that the first switch is connected in series between the first node and the first electrode terminal of the DC power source;

a second switch connected in series between the first node and a second node which is configured to be connected to the second electrode terminal of the DC power source;
a soft switch circuit including
a capacitor connected in series between a third node and one of the first node and the second node,
a charge-discharge switch connected in series between the third node and another of the first node and the second node, and
a charge-discharge resistor connected in parallel to the charge-discharge switch;
a power switching element having a drain terminal, a gate terminal connected to the first node, and a source terminal connected to the second node; and
a controller configured to detect a current flowing through the drain terminal and the source terminal of the power switching element, and controls the first switch, the second switch, and the charge-discharge switch.

2. The switch circuit of claim 1, further comprising a signal inverter connected to the first switch and the second switch,
wherein the first switch has a first control port that receives a control signal that turns on and off the first switch,
wherein the second switch has a second control port that receives a control signal that turns on and off the second switch,
wherein the signal inverter is connected between the first control port and the second control port, and
wherein the controller inputs, to only one of the first control port and the second control port, the control signal to execute the first control.

3. The switch circuit of claim 1, wherein the controller is configured to:
repetitively execute a first control in which the controller turns on the first switch and turns off the second switch simultaneously to the turning on of the first switch, and subsequently, the controller turns off the first switch and turns on the second switch simultaneously to the turning off of the first switch;
repetitively execute a second control in which the controller switches the charge-discharge switch from turning off of the charge-discharge switch to turning on of the charge-discharge switch at a time point at a lapse of a predetermined time period from a time point when the controller switches the second switch from turning off of the second switch to tuning on of the second switch in the first control, and then, the controller switches the charge-discharge switch from tuning on of the charge-discharge switch to tuning off of the charge-discharge switch simultaneously when the controller switches the second switch from tuning on of the second switch to turning off of the second switch in the first control; and
turn off the first switch, turn on the second switch, and switch the charge-discharge switch from turning off of the charge-discharge to turning on of the charge-discharge at a time point when the controller detects that the current flowing across the drain terminal and the source terminal of the power switching element is equal to or larger than a predetermined threshold while the first switch is turned on.

4. The switch circuit of claim 3, wherein the controller repetitively executes the first control and the second control unless detecting that the current flowing across the drain terminal and the source terminal of the power switching element is equal to or larger than the predetermined threshold while turning on the first switch.

5. The switch circuit of claim 4, wherein the controller continuously turns off the charge-discharge switch at the time point when the controller switches the second switch from tuning off of the second switch to turning on of the second switch in the first control unless detecting that the current flowing across the drain terminal and the source terminal of the power switching element is equal to or larger than the predetermined threshold while turning on the first switch.

6. The switch circuit of claim 3, further comprising a signal inverter connected to the first switch and the second switch,
wherein the first switch has a first control port that receives a control signal that turns on and off the first switch,
wherein the second switch has a second control port that receives a control signal that turns on and off the second switch,
wherein the signal inverter is connected between the first control port and the second control port, and
wherein the controller inputs, to only one of the first control port and the second control port, the control signal to execute the first control.

* * * * *